United States Patent
Su et al.

(10) Patent No.: US 10,483,952 B1
(45) Date of Patent: Nov. 19, 2019

(54) BASELINE WANDER CORRECTION USING ZERO AND ONE MISMATCH ADAPTATION

(71) Applicant: Oracle International Corporation, Redwood Shores, CA (US)

(72) Inventors: Jianghui Su, San Jose, CA (US); Xun Zhang, Westford, MA (US); Muthukumar Vairavan, Sunnyvale, CA (US); Rajesh Kumar, Campbell, CA (US); Dawei Huang, San Diego, CA (US)

(73) Assignee: Oracle International Corporation, Redwood Shores, CA (US)

( * ) Notice: Subject to any disclaimer, the term of this patent is extended or adjusted under 35 U.S.C. 154(b) by 0 days.

(21) Appl. No.: 15/971,126

(22) Filed: May 4, 2018

(51) Int. Cl.
  *H03K 5/007* (2006.01)
  *H03F 3/45* (2006.01)
  *H04L 25/03* (2006.01)
  *H03G 3/30* (2006.01)

(52) U.S. Cl.
  CPC ......... *H03K 5/007* (2013.01); *H03F 3/45076* (2013.01); *H03G 3/3042* (2013.01); *H04L 25/03006* (2013.01); *H04L 2025/03789* (2013.01)

(58) Field of Classification Search
  CPC ....................................................... H03K 5/007
  USPC ........................................................ 375/317
  See application file for complete search history.

(56) References Cited

U.S. PATENT DOCUMENTS

| | | | |
|---|---|---|---|
| 6,983,403 B2 | 1/2006 | Mayweather et al. | |
| 7,961,817 B2 | 6/2011 | Dong et al. | |
| 9,485,120 B1 | 11/2016 | Sun | |
| 2010/0309810 A1* | 12/2010 | Wachsmann | H04L 1/0045 370/252 |
| 2016/0080176 A1 | 3/2016 | Kotagiri et al. | |
| 2017/0155424 A1* | 6/2017 | Feyh | H04B 3/04 |

* cited by examiner

*Primary Examiner* — Lihong Yu
(74) *Attorney, Agent, or Firm* — Meyertons, Hood, Kivlin, Kowert & Goetzel, P.C.

(57) ABSTRACT

A method and an apparatus for correcting baseline wander is disclosed. The method and apparatus may include receiving a serial data stream that encodes a plurality of data symbols, and determining an average magnitude of a first data value included in one or more data symbols of a subset of the plurality of data symbols, and an average magnitude of a second value included in the one of more data symbols of the subset of the plurality of data symbols. A common mode operating point of an equalizer circuit may be adjusted using the average magnitude of the first data value and the average magnitude of the second data value.

20 Claims, 5 Drawing Sheets

BASELINE WANDER CORRECTION USING ZERO AND ONE MISMATCH ADAPTATION

BACKGROUND

Technical Field

Embodiments described herein are related to the field of high-speed interface design, and more particularly to reducing baseline wander.

Description of the Related Art

Computing systems typically include a number of interconnected integrated circuits. In some cases, the integrated circuits may communicate using communication channels or links to transmit and receive data bits. The communication channels may support parallel communication, in which multiple data bits are transmitted in parallel, or serial communication, in which data bits are transmitted one bit at a time in a serial fashion.

The data transmitted between integrated circuits may be encoded to aid in transmission. For example, in the case of serial communication, data may be encoded to provide sufficient transitions between logic states to allow for clock and data recovery circuits to operate. Alternatively, in the case of parallel communication, the data may be encoded to reduce switching noise or to improve signal integrity.

During transmission of the data, the physical characteristics of the communication channel may attenuate a transmitted signal associated with a particular data bit. For example, the impedance of wiring included in the communication channel or link may attenuate certain frequency ranges of the transmitted signal. Additionally, impedance mismatches between wiring included in the communication channel and devices coupled to the communication channel may induce reflections of the transmitted signal, which may degrade subsequently transmitted signals corresponding to other data bits.

SUMMARY OF THE EMBODIMENTS

System and methods disclosed herein provide techniques for correcting baseline wander. In a non-limiting embodiment, an equalizer circuit may be configured to receive a serial data stream that encodes a plurality of data symbols. A circuit may be configured to determine an average magnitude of a first data value included using a subset of the plurality of data symbols, and determine an average magnitude of a second data value using the subset of the plurality of data symbols. The circuit may be further configured to adjust a common mode operating point of the equalizer circuit using the average magnitude of the first data value and the average magnitude of the second data value.

In one embodiment, the circuit may be further configured to compare the average magnitude of the first data value to the average magnitude of the second data value.

In another specific embodiment, the circuit may be further configured to accumulate, over a period of time, a number data symbols of the plurality of data symbols having the first data value, and accumulate, over the period of time, a number of data symbols having the second data value.

BRIEF DESCRIPTION OF THE DRAWINGS

The following detailed description makes reference to the accompanying drawings, which are now briefly described.

Figure 1:
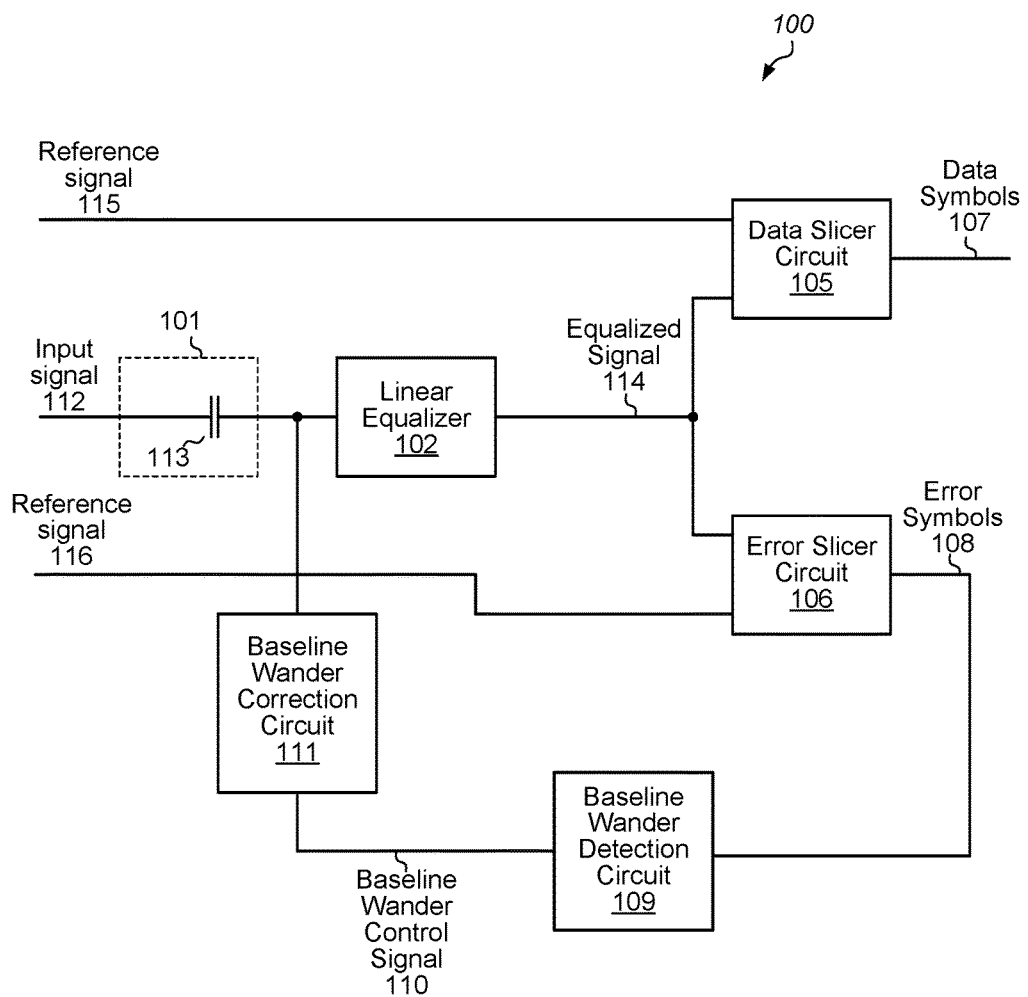
FIG. 1 is a block diagram that illustrates an embodiment of a data receiver circuit that includes baseline wander detection and correction circuits.

While the disclosure is susceptible to various modifications and alternative forms, specific embodiments thereof are shown by way of example in the drawings and will herein be described in detail. It should be understood, however, that the drawings and detailed description thereto are not intended to limit the disclosure to the particular form illustrated, but on the contrary, the intention is to cover all modifications, equivalents and alternatives falling within the spirit and scope of the present disclosure as defined by the appended claims. The headings used herein are for organizational purposes only and are not meant to be used to limit the scope of the description. As used throughout this application, the word "may" is used in a permissive sense (i.e., meaning having the potential to), rather than the mandatory sense (i.e., meaning must). Similarly, the words "include," "including," and "includes" mean including, but not limited to.

DETAILED DESCRIPTION OF EMBODIMENTS

A computing system may include one or more integrated circuits, such as, e.g., a central processing unit (CPU) and memories. Each one of the integrated circuits of the computing system may communicate through either a serial or parallel interface. In a parallel interface, multiple data bits are communicated simultaneously, while in a serial interface, data is communicated as a series of sequential single data bits. When employing a serial interface to communicate data between two devices included in a computing system, the data may be transmitted according to different protocols. For example, the data may be transmitted using return to zero (RZ), non-return to zero (NRZ), pulse amplitude modulation (PAM), or any suitable combination thereof.

In the computing system, different devices may have different electrical operating parameters. As such, devices may be AC coupled using a series capacitor to a communication channel or link between the devices, which removes the DC component of the transmitted signals. In various embodiments, use of such series capacitors may allow for the common-mode of the received signal to be independently defined regardless of common-mode voltage from the transmitter Since there is no common DC reference between devices, the DC level at a receiving device is dependent upon the received data. This dependency on the data of the DC level at the receiving device is commonly referred to as "baseline wander."

When designing circuits to receive data via such communication channels or links, the system may be treated as being linear, with the magnitude of a logical-1 value and a logical-0 value being the same, but of opposite polarity. Many adaptation and signal processing algorithms assume the system is linear. Real systems, however, may not be perfectly linear due to manufacturing defects, design limitations, and the like.

In AC coupled systems, baseline wandering may be sensitive to a transmitted data pattern. For example, when an imbalanced data pattern is transmitted, i.e., a data pattern that has more of one logic or data value than another, the common mode of an input to an equalizer circuit may drift based on the data pattern. To compensate for such drift, receiver circuits may employ an analog circuit to compensate for drift at the input of the equalizer circuit by sinking or sourcing a current to the input of the equalizer circuit. An amount of correction may be a precise function of the input signal, and it may be difficult to determine the magnitude of the input signal. Moreover, such analog circuits are sensitive to process and temperature change, and may consume an undesirable amount of power. The embodiments illustrated in the drawings and described herein may provide techniques for mitigating the effects of baseline wander, while reducing power consumption, improving the overall communication link margin, and improving accuracy.

An embodiment of a data receiver circuit is illustrated in FIG. 1. In the illustrated embodiment, data receiver circuit 100 includes equalizer circuit 102, data slicer circuit 105, error slicer circuit 106, baseline wander detection circuit 109, and baseline wander correction circuit 111.

Input signal 112 is coupled to an input of equalizer circuit 102 via coupling circuit 101. In various embodiments, coupling circuit 101 includes a series capacitor 113 to remove a DC component of input signal 112. Coupling an input signal to a receiver circuit using a series capacitor to remove a DC component of the input signal is commonly referred to as "AC coupling." In various embodiments, input signal 112 may encode a plurality of data symbols. It is noted that although a single input signal on a single wire is depicted in the present embodiment, in other embodiments, multiple wires with respective input signals may be employed.

Equalizer circuit 102 may be configured to generate equalized signal 114. In various embodiments, equalizer circuit 102 may employ multiple stages of amplification, which have less gain at lower frequencies than higher frequencies, thereby implementing a high pass transfer function. Such a transfer function may, in various embodiments, compensate for losses in the communication channel through which input signal 112 is transmitted. In some embodiments, equalizer circuit 102 may be a continuous time linear equalizer or other suitable equalizer circuit.

Data slicer circuit 105 may be configured to compare equalized signal 114 to reference signal 115 to generate data signal 107. In various embodiments, data signal 107 includes a series of logical values based on the result of the comparison of equalized signal 114 and reference signal 115.

As used and described herein a logic or logical value of a signal corresponds to a particular voltage level of a signal designated to represent a particular value of a data bit. For example, a logical-0 or logic 0 value may, in various embodiments, correspond to a voltage level at or near ground potential, while a logical-1 or logic 1 value may correspond to a voltage level sufficient to enable an n-channel metal-oxide semiconductor field-effect transistor (MOSFET) and disable a p-channel MOSFET.

Error slicer circuit 106 may be configured to compare equalized signal 114 to reference signal 115 to generate error signal 108. In various embodiments, error signal 108 may include a series of logical values based on a result of the comparison of equalized signal 114 and reference signal 116. Reference signal 115 may, in some embodiments, correspond to an expected magnitude of a particular logic value. The expected magnitude should, in various embodiments, correspond to the average magnitude of all received symbols. By separately estimating the magnitude of logical-0 symbols and logical-1 values, and comparing the difference, a determination of which average magnitude, either the logical-0 or the logical-1 symbols, is greater than or less than zero.

It is noted that although data slicer circuit 105 and error slicer circuit 106 are shown as directly using equalized signal 114, in other embodiments, equalized signal 114 may be further processed by a voltage gain amplifier, a summer circuit, or any other suitable circuit (all not shown for the sake of clarity).

Baseline wander detection circuit 109 is configured to determine an average magnitude of a number of data symbols using a subset of the plurality of data symbols encoded in input signal 112 and determine an average magnitude of a number of data symbols of a second logic value using the subset of the plurality of data symbols. As used and described herein, an average magnitude refers to an average value of differences between an expected symbol value and an actual symbol value.

To determine the average magnitudes, baseline wander detection circuit 109 is configured to accumulate a number of data symbols of a first logic value from a subset of the plurality of data symbols encoded in input signal 112 using error signal 108. Baseline wander detection circuit 109 is also configured to accumulate a number of data symbols of a second logic value from the subset of the plurality of data symbols using error signal 108. As described below in more detail, the subset of the plurality of data symbols may be determined based on a particular time period. In various embodiments, the first logic value may correspond to a logical-0 and the second logic value may correspond to a logical-1 value.

Using the accumulated number of data symbols with the first logic value and the accumulated number of data symbols with the second logic value, baseline wander detection circuit 109 is configured to generate baseline wander control signal 110. In various embodiments, baseline wander detection circuit 109 may reset the accumulation of the data symbols with the first and second logic values after a particular time period has elapsed.

Baseline wander correction circuit 111 is configured to adjust a common mode operating point of equalizer circuit 102 based on baseline wander control signal 110. For example, if the average magnitude of the logical-1 value is greater than zero, then the common mode voltage for a P net included in baseline wander correction circuit 111 may be increased and the common mode voltage for a N net included in baseline wander correction circuit 111 may be decreased.

In various embodiments, baseline wander correction circuit 111 may include one or more current sources configured to sink or source current from the input to equalizer circuit 102. A value of the current and whether the current is sourced or sunk is based on baseline wander control signal 110. In some cases, the current sources may include n-channel or p-channel metal-oxide semiconductor field-effect transistors, or other suitable transconductance devices.

It is noted that the embodiment illustrated in FIG. 1 is merely an example. In other embodiments, different circuit blocks and different arrangements of circuit blocks are possible and contemplated.

Figure 2:
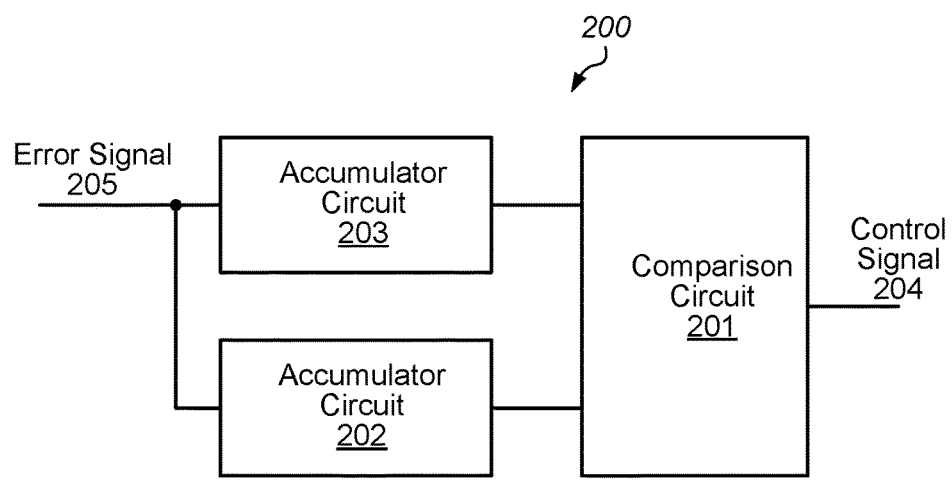
FIG. 2 is a block diagram that illustrates an embodiment of a baseline wander detection circuit.

As described above, to compensate for baseline wander, the average magnitude of logical-0 and logical-1 values over a period of time may be determined. In various embodiments, the average magnitudes may be determined using separate accumulators for both logic values. An embodiment of such a circuit is illustrated in FIG. 2. In some embodiments, baseline wander detection circuit 200 may correspond to baseline wander detection circuit 109 as illustrated in FIG. 1. In the illustrated embodiment, baseline wander detection circuit 200 includes comparison circuit 201, accumulator circuit 202, and accumulator circuit 203.

Each of accumulator circuit 202 and accumulator circuit 203 are coupled to error signal 205. In various embodiments, error signal 205 may correspond to error signal 108 as illustrated in FIG. 1. Accumulator circuit 202 may be configured to accumulate a number of logical-1 values included in error signal 205 in a subset of a plurality of data symbols included in an incoming serial data stream, and accumulator circuit 203 may be configured to accumulate a number of logical-0 values included in error signal 205 included in the subset of the plurality of data symbols. In various embodiments, the subset of the plurality of data symbols may include a number of data symbols of the plurality of data symbols detected over a period of time. It is noted that the accumulated values generated by accumulator circuit 202 and accumulator circuit 203 may correspond to the average magnitude of logical-1 and logical-0 values received as part of the subset of the plurality of data symbols.

Accumulator circuit 202 and accumulator circuit 203 may, in some embodiments, be a particular embodiment of a counter or other sequential logic circuit configured to increment a value in response to a particular logic value. In some cases, accumulator circuit 202 and accumulator circuit 203 may include circuits configured to reset the count value after the aforementioned period of time has elapsed.

Comparison circuit 201 is coupled to accumulator circuit 202 and accumulator circuit 203, and may be configured to compare an output of accumulator circuit 202 and an output of accumulator circuit 203 to generate control signal 204. In some of embodiments, comparison circuit 201 may generate a particular logic value in response to determining the average magnitude of logical-1 values is greater than the average magnitude of logical-0 values, and generate a different logic value in response to determining that the average magnitude of logical-0 values is greater than the average magnitude of logical-1 value.

In various embodiments, comparison circuit 201 may include any suitable combination of logic gates or circuit configured to compare the accumulated values generated by accumulator circuit 202 and accumulator circuit 203. In some cases, comparison circuit 201 may perform a bitwise comparison of the two accumulator circuit values.

It is noted that the embodiment illustrated in FIG. 2 is merely an example. In other embodiments, different circuit blocks and different configurations of circuit blocks are possible and contemplated Turning to FIG. 3, an example waveform of a baseline wander control signal, such as baseline wander control signal 110, for example. In the illustrated embodiment, baseline wander control signal 301 may correspond to control signal 204 as illustrated in FIG. 2.

At time t0, the voltage level of baseline wander control signal 301 is v0. Accumulator circuits, such as accumulator circuit 202 and accumulator circuit 203 may then individual accumulate the number of logical-0 value and the logical-1 values between times t0 and t1. It is noted that the time period, i.e., the difference between time t0 and t1, may predetermined, or it may be changed, under software control, during operation based on environmental changes, previous baseline wander correction values, changes in performance requirements, and the like.

Figure 3:
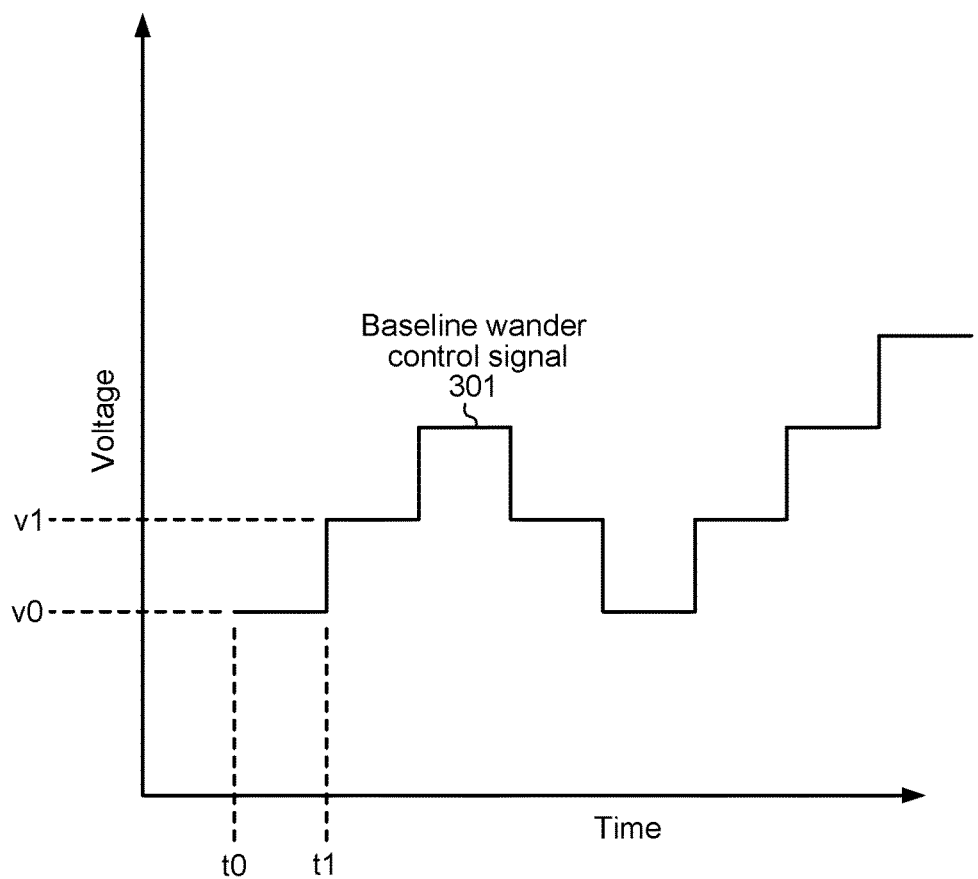
FIG. 3 illustrates a waveform depicting a baseline wander correction signal.

At time t1, a comparison circuit, such as comparison circuit 201, may compare the accumulated logic values and, based on a result of the comparison, adjust the voltage level of baseline wander control signal 301. In the present embodiment, the voltage level of baseline wander correction signal increases from voltage v0 to voltage v1. The difference between voltage v0 and voltage v1 may be a preset value, or it may be based on the absolute magnitude of the difference between the accumulated logic value numbers. The process may continue after time t1, with baseline wander control signal 301 being adjusted, after each time period, based on a result of various comparisons It is noted that the waveform depicted in FIG. 3 is merely an example. In other embodiments, different waveforms are possible and contemplated.

Figure 4:
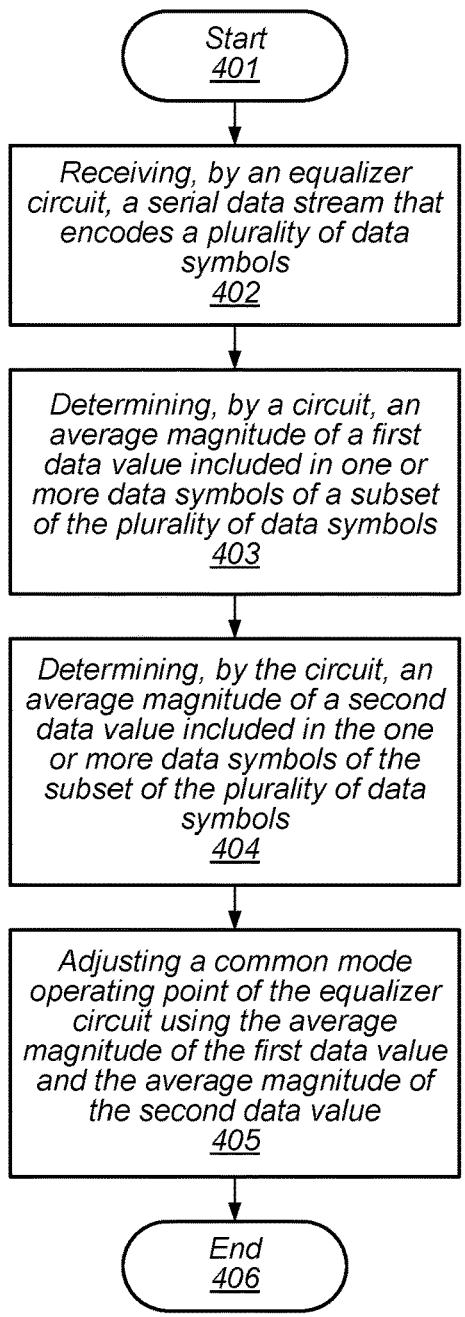
FIG. 4 is a flow diagram depicting an embodiment of a method for correcting baseline wander associated with a data receiver circuit.

Turning to FIG. 4, a flow diagram depicting an embodiment of a method for operating a data receiver circuit, such as, e.g., data receiver circuit 100 as depicted in FIG. 1, to reduce baseline wander is illustrated. The method begins in block 401. It is noted that method depicted in the flow diagram of FIG. 4 may be performed in a looped fashion, with the method being repeated at periodic intervals during operation of the communication channel or link.

An equalizer circuit may then receive a serial data stream that encodes a plurality of data symbols (block 402). In various embodiments, the serial data stream may be received via a communication bus (also referred to as a "communication link") that is AC coupled to the equalizer circuit. The communication bus may include multiple wires, and data may be differentially encoded using two wires of the communication bus.

A circuit, such as, e.g., baseline wander detection circuit 109, may determine an average magnitude of a first data value included in one or more data symbols of a subset of the plurality of data symbols (block 403). The circuit may then also determine an average magnitude of a second data value included in the one or more data symbols of the subset of the plurality of data symbols (block 404). Such determinations may be made over a particular period of time. After the particular period of time has elapsed, the method may be repeated.

In various embodiments, the average magnitudes of the first and second data values may be based on a comparison of the equalized signal and an adapted reference signal, such as reference signal 116, for example. Such a comparison may be performed, in some embodiments, by error slicer circuit 106. Accumulator circuit 202 and accumulator circuit 203 may separately determine a number of the first and second data values based on error signal 108 to determine the respective magnitudes of the first and second data values.

A common mode operating point of the equalizer circuit may then be adjusted using the average magnitude of the first data value and the average magnitude of the second data values (block 405). In various embodiments, comparison circuit 201 may compare the average magnitude of the first data value may be compared to the average magnitude of the second data value to generate a comparison result. Baseline wander correction circuit 111 to adjust the common mode operating point of equalizer circuit 102 may use the comparison result.

In some embodiments, baseline wander correction circuit 111 may sink or source current from the input of equalizer circuit 102 based on the comparison result to adjust the common mode operating point of the input to equalizer circuit 102. It is noted that although input signal 112 is depicted as a single wire, in other embodiments, multiple wires may be employed, and separate current adjustments may be made to each wire. The method may then conclude in block 406.

It is noted that the embodiment of the method depicted in the flow diagram of FIG. 4 is merely an example. In other embodiments, different operations and different orders of operations are possible and contemplated.

Figure 5:
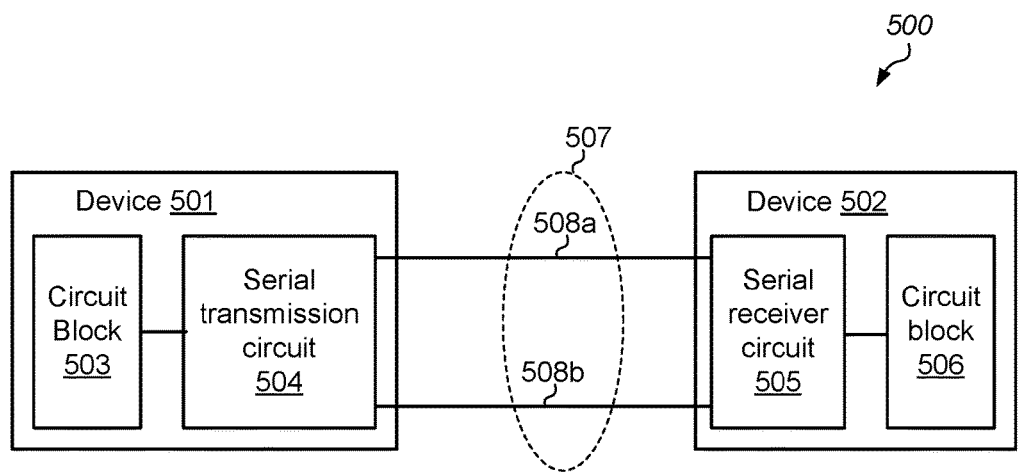
FIG. 5 illustrates an embodiment of a computing system.

As described above, a data receiver circuit, such as, e.g., data receiver circuit 100, may be employed in a computer system. An embodiment of such computer system is illustrated in FIG. 5. In the illustrated embodiment, computer system 500 includes devices 501 and 502, coupled by communication bus 507.

Device 501 includes circuit block 503 and serial transmission circuit 504. In various embodiments, device 501 may be a processor, processor core, memory, input/output circuit, analog/mixed signal circuit, or any other suitable circuit block that may be included in an integrated circuit. It is noted that although device 501 is depicted as only including circuit block 503 and serial transmission circuit 504, in other embodiments, multiple other circuit sub-blocks may be included in device 501.

Serial transmission circuit 504 may be configured to transmit signals via communication bus 507 corresponding to data received from circuit block 503. Such signals may differentially encode one or more data bits, where a difference in between voltage levels of the signals included in wires 508a and 508b correspond to a particular logic level. In some cases, the generation of signals may include encoding the data bits, converting voltage levels associated with the data bits or any other suitable processing. It is noted that although two wires are included in communication bus 507, in other embodiments, any suitable number of signal lines may be employed.

Device 502 includes serial receiver circuit 505 and circuit block 506. Like device 501, device 502 may be a processor, processor core, memory, or any other suitable circuit block configured to receive data from serial transmission circuit 504. Serial receiver circuit 505 may, in various embodiments, correspond to data receiver circuit 100 as illustrated in FIG. 1, and may be configured to receive signals transmitted on communication bus 507 and convert the received signals to data bits. The data bits may then be sent to circuit block 506 for further processing.

In various embodiments, device 501 and device 502 may employ different power supply signals, and may be coupled to communication bus 507 using one or more series capacitors. As described above, serial receiver circuit 505 may be subject to the effects of baseline wander. To remediate such effects, serial receiver circuit 505 may employ techniques similar to those discussed above in regard to FIG. 1 to correct baseline wander.

It is noted that devices 501 and 502 may be fabricated on a single silicon substrate, or may be separately fabricated integrated circuits coupled together on a circuit board or other suitable substrate. Although only two devices are depicted in the embodiment of FIG. 5, in other embodiments, any suitable number of devices may be employed.

Although specific embodiments have been described above, these embodiments are not intended to limit the scope of the present disclosure, even where only a single embodiment is described with respect to a particular feature. Examples of features provided in the disclosure are intended to be illustrative rather than restrictive unless stated otherwise. The above description is intended to cover such alternatives, modifications, and equivalents as would be apparent to a person skilled in the art having the benefit of this disclosure.

The scope of the present disclosure includes any feature or combination of features disclosed herein (either explicitly or implicitly), or any generalization thereof, whether or not it mitigates any or all of the problems addressed herein. Accordingly, new claims may be formulated during prosecution of this application (or an application claiming priority thereto) to any such combination of features. In particular, with reference to the appended claims, features from dependent claims may be combined with those of the independent claims and features from respective independent claims may be combined in any appropriate manner and not merely in the specific combinations enumerated in the appended claims.

What is claimed is:

1. An apparatus, comprising:
   an equalizer circuit configured to receive a serial data stream, wherein the serial data stream encodes a plurality of data symbols; and
   a circuit configured to:
      determine an average magnitude of a first data value using a subset of the plurality of data symbols;
      determine an average magnitude of a second data value using the subset of the plurality of data symbols; and
      adjust a common mode operating point of the equalizer circuit by sinking a current from an input of the equalizer circuit, wherein a value of the current is based on a comparison of the average magnitude of the first data value and the average magnitude of the second data value.

2. The apparatus of claim 1, wherein to adjust the common mode operating point of the equalizer circuit, the circuit is further configured to compare the average magnitude of the first data value to the average magnitude of the second data value.

3. The apparatus of claim 1, wherein to determine the average magnitude of the first data value, the circuit is further configured to accumulate, over a period of time, a number of data symbols of the plurality of data symbols having the first data value, and wherein to determine the average magnitude of the second data value, the circuit is further configured to accumulate, over the period of time, a number of data symbols having the second data value.

4. The apparatus of claim 1, wherein the equalizer circuit is further configured to generate an equalized signal based on the serial data stream, and further comprising an error slicer circuit configured to compare the equalized signal to a reference voltage to generate a plurality of error symbols.

5. The apparatus of claim 4, wherein the circuit includes:
   a first counter circuit configured to accumulate, over a period of time, a number of first data symbols of the plurality of data symbols having the first data value using the plurality of error symbols; and
   a second counter circuit configured to accumulate, over the period of time, a number of second data symbols of the plurality of data symbols having the second data value using the plurality of error symbols.

6. The apparatus of claim 1, wherein the circuit is further configured to adjust the common mode operating point of the equalizer circuit by sourcing a different current to the input of the equalizer circuit, wherein a value of the different current is based on the comparison of the average magnitude of the first data value and the average magnitude of the second data value.

7. The apparatus of claim 1, wherein the equalizer circuit is configured to receive the serial data stream via a communication bus, wherein the equalizer circuit is coupled to the communication bus using one or more capacitors.

8. A method, comprising:
receiving a serial data stream by an equalizer circuit, wherein the serial data stream includes a plurality of data symbols;
determining, by a circuit, an average magnitude of a first data value using a subset of the plurality of data symbols;
determining, by the circuit, an average magnitude of a second data value using one or more data symbols of the subset of the plurality of data symbols; and
adjusting a common mode operating point of the equalizer circuit by sinking, by the circuit, a current from an input of the equalizer circuit, wherein a value of the current is based on a result of comparing the average magnitude of the first data value and the average magnitude of the second data value.

9. The method of claim 8, further comprising adjusting the common mode operating point of the equalizer circuit by sourcing a different current to the input of the equalizer circuit, wherein a value of the different current is based on the comparison of the average magnitude of the first data value and the average magnitude of the second data value.

10. The method of claim 8, further comprising generating, by the equalizer circuit, an equalized signal based on the serial data stream.

11. The method of claim 10, further comprising, comparing, by an error slicer circuit, the equalized signal and a reference voltage to generate a plurality of error symbols.

12. The method of claim 11, further comprising:
accumulating, by a first counter circuit, a first number of data symbols of the first data value of the plurality of data symbols over a period of time; and
accumulating, by a second counter circuit, a second number of data symbols of the second data value of the plurality of data symbols over the period of time.

13. The method of claim 12, wherein adjusting the common mode operating point of the equalizer circuit includes comparing the first number of data symbols of the first data value and the second number of data symbols of the second data value.

14. The method of claim 8, further comprising, receiving the serial data stream via a communication bus coupled to the equalizer circuit using one or more capacitors.

15. A system, comprising:
a first device configured to transmit a serial data stream, wherein the serial data stream encodes a plurality of data symbols; and
a second device including an equalizer circuit, wherein the second device is configured to:
receive the serial data stream;
determine an average magnitude of a first data value using one or more data symbols of a subset of the plurality of data symbols;
determine an average magnitude of a second data value using the one or more data symbols of the subset of the plurality of data symbols; and
adjust a common mode operating point of the equalizer circuit by sinking a current from an input of the equalizer circuit, wherein a value of the current is based on a comparison of the average magnitude of the first data value and the average magnitude of the second data value.

16. The system of claim 15, wherein the second device is further configured to adjust the common mode operating point of the equalizer circuit by sourcing a different current to the input of the equalizer circuit, wherein a value of the different current is based on the comparison of the average magnitude of the first data value and the average magnitude of the second data value.

17. The system of claim 15, wherein the equalizer circuit is configured to generate an equalized signal using the serial data stream.

18. The system of claim 17, wherein the second device includes an error slicer circuit configured to compare the equalized signal and a reference voltage to generate a plurality of error symbols.

19. The system of claim 18, wherein to determine the average magnitude of a first data value, the second device is further configured to accumulate a first number of data symbols of the first data value over a period of time, and wherein to determine the average magnitude of the second data value, the second device is further configured to accumulate a second number of data symbols of the second data value over the period of time.

20. The system of claim 19, wherein to adjust the common mode operating point of the equalizer circuit, the second device is further configured to compare the first number of data symbols of the first data value and the second number of data symbols of the second data value.

* * * * *